United States Patent [19]

Lang

[11] Patent Number: 5,393,996

[45] Date of Patent: Feb. 28, 1995

[54] INTEGRATED SEMICONDUCTOR CONFIGURATION

[75] Inventor: Alfred Lang, München, Germany

[73] Assignee: Siemens Aktiengesellschaft, Munich, Germany

[21] Appl. No.: 230,637

[22] Filed: Apr. 21, 1994

[30] Foreign Application Priority Data

Apr. 21, 1993 [DE] Germany .............................. 4313053

[51] Int. Cl.⁶ ..................... H01L 27/02; H01L 27/10; H01L 27/15
[52] U.S. Cl. .................... 257/210; 257/207; 257/390
[58] Field of Search ............... 257/207, 210, 208, 206, 257/390, 202

[56] References Cited

U.S. PATENT DOCUMENTS 5,136,357  8/1992  Hesson et al. ........................ 357/51

FOREIGN PATENT DOCUMENTS

| 0181600 | 5/1986 | European Pat. Off. ............ 257/545 |
| 59-46044 | 3/1984 | Japan .................................... 257/207 |
| 59-163837 | 9/1984 | Japan .................................... 257/207 |
| 63-107140 | 5/1988 | Japan .................................... 257/206 |
| 2-90649 | 3/1990 | Japan .................................... 257/207 |
| 4-49662 | 2/1992 | Japan .................................... 257/207 |
| 4-61275 | 2/1992 | Japan .................................... 257/208 |

OTHER PUBLICATIONS

IBM Technical Disclosure Bulletin 30 (1988) May, No. 12, p. 4, "CMOS Gate with Low Inductance of . . . ".

Primary Examiner—Jerome Jackson
Assistant Examiner—Donald L. Monin, Jr.
Attorney, Agent, or Firm—Herbert L. Lerner; Lauence A. Greenberg

[57] ABSTRACT

An integrated semiconductor configuration includes a semiconductor substrate of a first conductivity type being connected to a first supply potential, having a first region in which switching stages with signal terminals are disposed, and having at least a second region in which at least one connecting line is disposed for connecting the signal terminals of the switching stages. A multiplicity of doping zones are disposed in the second region and have a second conductivity type complementary to the first conductivity type. The doping zones are connected to a second supply potential, the doping zones have a total surface area, and at least a portion of the total surface area is located under the at least one connecting line. The first and second regions are strip-shaped. The first and second regions have long sides bordering one another. The second region has a width and each of the doping zones of the second region extend over the width of the second region. The semiconductor substrate has a segment of the first conductivity type being located between each two of the doping zones.

3 Claims, 3 Drawing Sheets 5,393,996

INTEGRATED SEMICONDUCTOR CONFIGURATION

BACKGROUND OF THE INVENTION

Field of the Invention

The invention relates to an integrated semiconductor configuration having a semiconductor substrate of a first conductivity type being connected to a first supply potential, having a first region in which switching stages are disposed and having at least a second region in which at least one connecting line is disposed for connecting signal terminals of the switching stages, a number of doping zones being provided in the second region and having a second conductivity type complementary to the first conductivity type, the doping zones being connected to a second supply potential, and at least a portion of a total surface area of the doping zones being located under the connecting line.

One such integrated semiconductor configuration is known from U.S. Pat. No. 5,136,357.

In integrated semiconductor configurations, a parasitic capacitor is active between the signal line that connects the output of one switching stage to the input of a further switching stage and the supply potential with which the semiconductor substrate is contacted. Upon switchover of the switching stage, the level of the signal line changes from H to L or vice versa. Consequently, the charge of the parasitic capacitor is also reversed. At a signal edge at which the capacitor is discharged, the discharge current flows as a short-circuit current across the components connected between the capacitor electrodes. At the signal edge at which the capacitor is charged, the charge current is furnished by the supply voltage source of the semiconductor configuration.

If a number of switching stages switch over synchronously, then such a high current pulse can arise on the connecting lines between the supply voltage source and the integrated switching stages on the semiconductor configuration that the parasitic inductors of the connecting lines become operative, and pulse-like voltages drop there. The supply voltage applied to the switching stages then drops during the switchover process. That lessens the security of the signals against interference. The parasitic inductors counteract the current pulse, so that a lesser current is available for reversing the charge of the parasitic capacitors of the signal lines connected on the output side to the switching stages. That increases the signal transit time.

In an integrated semiconductor configuration known from U.S. Pat. No. 5,136,357, the influence of the parasitic capacitors that are operative along the signal line is reduced by providing a number of doping zones in the second region that have a second conductivity type which is complementary to the first conductivity type, in which the doping zones are connected to a second supply potential, and in which at least some of the total surface area of the doping zones is located under the connecting line.

However, in the known semiconductor configuration, the first regions are distributed arbitrarily over the substrate, so that for any existing connecting line, a suitably located doping zone must be created, which then necessarily means that the doping zones are also distributed arbitrarily over the substrate. That involves considerable effort and expense in converting the particular circuit provided in the semiconductor configuration into masks for the production process.

SUMMARY OF THE INVENTION

It is accordingly an object of the invention to provide an integrated semiconductor configuration, which overcomes the hereinafore-mentioned disadvantages of the heretofore-known devices of this general type and which has a distribution of first and second regions that can be used for arbitrary circuits.

With the foregoing and other objects in view there is provided, in accordance with the invention, an integrated semiconductor configuration comprising a semiconductor substrate of a first conductivity type being connected to a first supply potential, having a first region in which switching stages with signal terminals are disposed, and having at least a second region in which at least one connecting line is disposed for connecting the signal terminals of the switching stages; a multiplicity of doping zones being disposed in the second region and having a second conductivity type complementary to the first conductivity type, the doping zones being connected to a second supply potential, the doping zones having a total surface area, and at least a portion of the total surface area being located under the at least one connecting line; the first and second regions being strip-shaped; the first and second regions having long sides bordering one another; the second region having a width and each of the doping zones of the second region extending over the width of the second region; and the semiconductor substrate having a segment of the first conductivity type being located between each two of the doping zones.

One advantage of this configuration according to the invention is that doping zones have to be provided only in the second regions, and these second regions are located at fixed points.

In accordance with another feature of the invention, the doping zones are rectangular and have identical dimensions including lengths, and the doping zones are mutually spaced apart by spacings being equal to the lengths of the doping zones.

In accordance with a concomitant feature of the invention, the first region has a doping zone of the second conductivity type on the long side thereof extending over the length of the long side, and the doping zones of the first and second regions are connected.

Other features which are considered as characteristic for the invention are set forth in the appended claims.

Although the invention is illustrated and described herein as embodied in an integrated semiconductor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
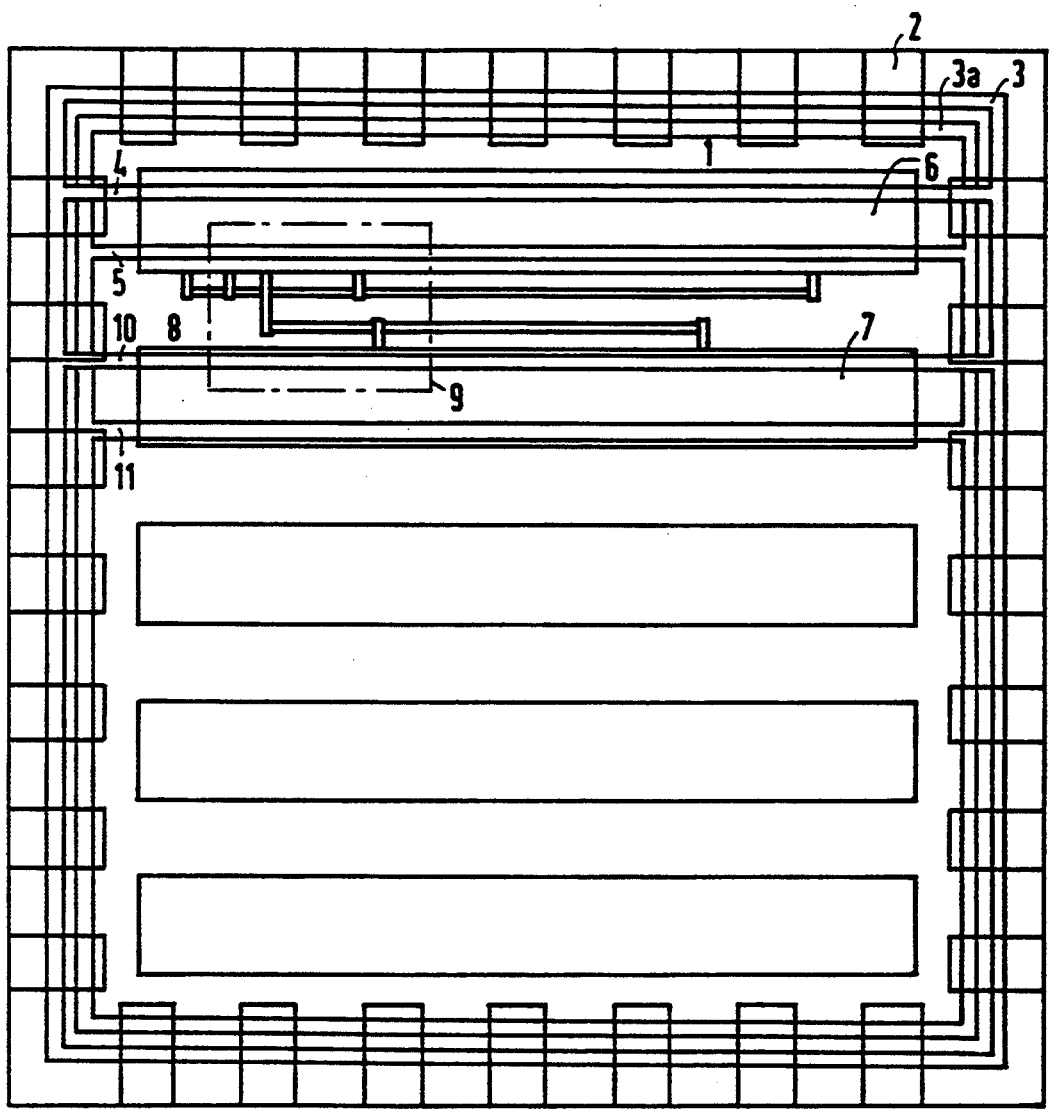
FIG. 1 is a diagrammatic, plan view of an integrated semiconductor chip.

Referring now to the figures of the drawing in detail and first, particularly, to FIG. 1 thereof, there is seen a semiconductor chip which is an integrated circuit made by CMOS technology, for instance. Shown on an n-doped substrate 1 are signal-processing switching stages including n-channel MOS transistors and p-channel MOS transistors, supply lines for a supply potential VDD and a supply potential VSS that is negative relative thereto, and signal lines that connect the switching stages at inputs and outputs thereof. In detail, the chip has peripheral cells 2 on its periphery for preparing input and output signals and for connecting the supply voltage. Extending over the peripheral cells 2 are at least two supply lines 3, 3a, each of which carries a supply potential. Regions 6, 7 with signal-processing circuit portions are disposed in an inner region of the chip. Located between the regions 6, 7 is a region 8 or wiring channel, in which signal connecting lines extend. Signal-processing switching stages are joined within one or a number of different signal-processing regions by the signal connecting lines. The switching stages of the signal-processing regions 6, 7 are supplied with voltage through respective sets of lines 4, 10 and 5, 11 for the supply potential VDD and the supply potential VSS. These potentials are connected to the proper lines 3, 3a on the chip periphery.

Corresponding doping zones for the channel regions and for the drain and source regions of the MOS transistors are provided in the regions 6, 7. A p-channel MOS transistor is constructed in the n-substrate and an n-channel MOS transistor is constructed in a p-tub or well made in the substrate. The semiconductor configuration may be made by standard cell technology, for instance. There, cells of predefined function are disposed in lines in accordance with the regions 6, 7.

Each cell contains transistors that are wired within the cell in accordance with the circuit function to be produced. The cells are connected to one another with connecting lines disposed in the wiring channel, depending on the function for the entire chip that the customer desires. The configuration of FIG. 1 may also be produced by gate array drafting. In this case, the starting point is unconnected transistors disposed in the substrate 1 in the regions 6, 7. These transistors are then wired locally inside the regions 6, 7 in order to produce cells, each of which executes a certain switching function. The signal connection between different cells is produced by means of connecting lines in the wiring channels 8.

Figure 2:
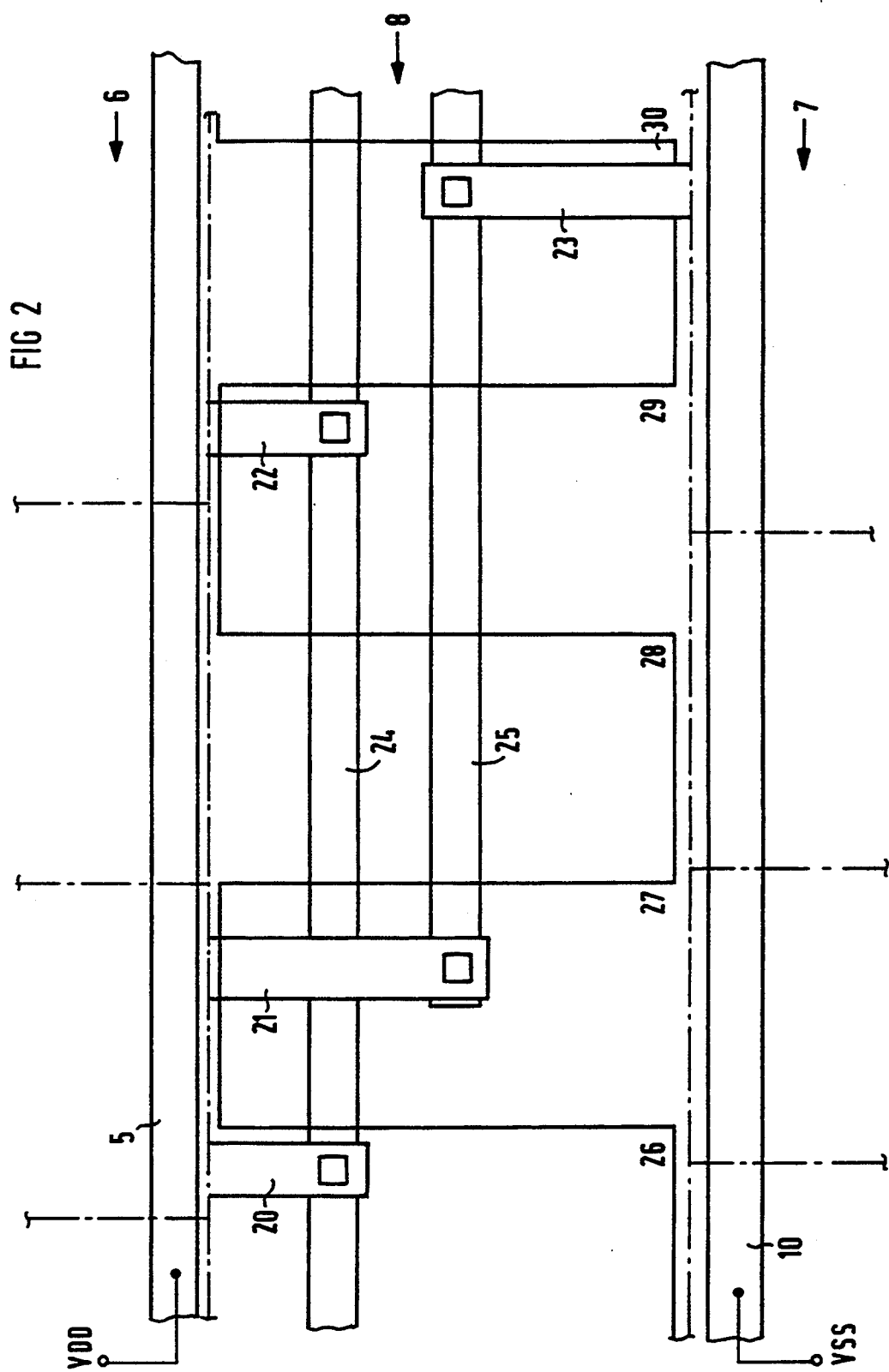
FIG. 2 is an enlarged, fragmentary, plan view of a portion of the configuration of FIG. 1 showing p-doping and n-doping zones in a wiring channel according to the invention.

A portion 9 of FIG. 1 that contains part of the wiring channel 8 with the adjacent regions 6, 7 is shown in FIG. 2. Conductor track segments 20, 21, 22, 23 of switching stages disposed in the regions 6, 7 extend into the wiring channel 8. They are joined to one another through conductor track segments 24, 25 extending at a right angle thereto. The conductor track segment 20, for instance, is the output of a switching stage that is connected through the conductor track segments 24, 22 to the input of a further switching stage in the region 6. In a corresponding manner, the inputs and outputs of switching stages of the regions 6, 7 are connected through the line segments 21, 25, 23. It is seen that n-substrate regions 26, 28, 30 alternate in the wiring channel 8 with p-tub or well regions 27, 29. The regions 6, 7 having the signal-processing circuit portions are typically laid out in such a way that the n-channel transistors of the region 7 and the p-channel transistors of the region 6 are disposed in the immediate vicinity of the wiring channel 8. This means that in the region 6, the n-substrate zone extends as far as the channel 8, and in the region 7 the p-tub or well zone does the same. The p-tubs or wells 27, 29 of the wiring channel 8 merge with the p-tub or well zone of the region 7. The n-zones 26, 28, 30 of the wiring channel 8 and the n-zones of the regions 6 likewise are connected. The n-substrate zone of the region 6 is connected to the supply line 5 by a number of contacts and is thus applied to the supply potential VDD. The p-tub or well zone of the region 7 is connected to the supply potential VSS through the supply line 10. It is thus assured that the p-n junctions between the zones 26, 27, 28, 29, 30 of the wiring channel 8 form a diode being polarized in the blocking direction.

Figure 3:
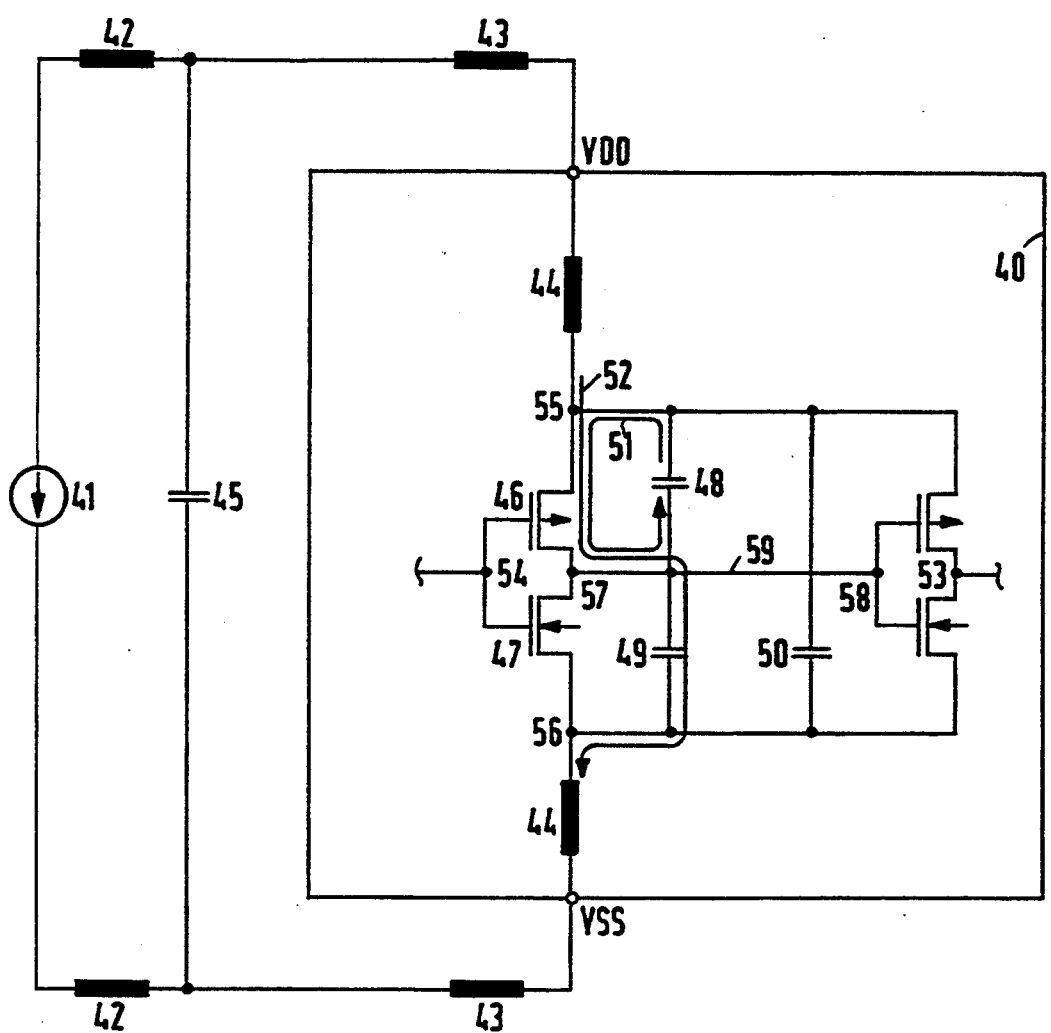
FIG. 3 is an electrical substitute schematic circuit diagram of a portion of the configuration of FIG. 2.

An electrical substitute circuit diagram of a portion of FIG. 2 is shown in FIG. 3 to explain the mode of operation. An integrated semiconductor chip 40 is supplied from a voltage source 41. Parasitic inductors 42, 43, 44 are operative in various connection lines for the supply potentials VDD, VSS. The action of the inductor 42 which is present, for instance, in the conductor tracks of a printed circuit, is compensated for by a capacitor 45. To that end, the charge contained in the capacitor 45 furnishes at least a portion of the current pulse received by the semiconductor chip 40. This portion of the current pulse does not cause any voltage drop at the inductors 42. In that case, one speaks of the voltage being supported on the applicable segment of the supply line leads. The parasitic inductors 43, 44 that follow between the connection point of the support capacitor 45 and supply terminals 55, 56 of the integrated switching stages are produced primarily by means of housing pins and bonding wires.

These inductors are not compensated for by the support capacitor 45. An inverter 54 including complementary MOS transistors 46, 47 is connected to the supply voltage inside the integrated circuit. This inverter is disposed, for instance, in the region 6 of the layout of FIG. 2. It has an output terminal 57 which is connected to an input terminal 58 of a further inverter 53, that is likewise disposed in the region 6. The output terminal 57 and the input terminal 58 are connected over a line 59 that extends within the wiring channel 8. The terminals 57, 58 correspond to the terminals of FIG. 2 that are connected to the lines 20, 22, and the line 59 corresponds to the line 24 of FIG. 2. A parasitic capacitor 48 acts between the output terminal 57 and the supply potential VDD, and a parasitic capacitor 49 acts between the output terminal 57 and the supply potential VSS. Capacitors which are distributed along the lines 20, 24, 22 are respectively contained in the capacitors 48, 49 facing the n-substrate zones 26, 28 connected to the positive supply potential VDD and facing the p-tub or well zones 27, 29 connected to the negative supply potential VSS.

Reference numerals 51, 52 indicate charge reversal currents, which flow from an L level to an H level, for instance, upon a switchover of the output signal of the inverter 54. In this process the parasitic capacitor 48 is discharged and the parasitic capacitor 49 is charged.

The discharging current of the capacitor 48 flows internally in the chip through the transistor 46. The charging current of the capacitor 49 is furnished by the supply terminals 55, 56 for the supply potentials VDD, VSS.

If the alternating substrate and tub or well zones in the wiring channel are of equal size, then the parasitic capacitors 48, 49 also have approximately equal capacitances. As compared to conventional semiconductor configurations, the capacitance of the capacitor having a charge which is reversed in the switchover process through the current furnished by the supply source is divided approximately in half. Consequently the charge reversal current is also less. The interfering influences on the supply voltage of the parasitic inductors that are active in the supply lines are therefore less as well.

The p-n junctions at the boundary layers of the n-substrate zones 26, 28, 30 and the p-tub or well zones 27, 29 form a diffusion capacitor that is located between the supply potentials VDD, VSS. In FIG. 3, this diffusion capacitor is connected as a capacitor 50 between the supply potentials VDD and VSS. The diffusion capacitor 50 advantageously acts as a support capacitor, which at least partly compensates for the effect of the parasitic inductors 43, 44.

I claim:

1. An integrated semiconductor configuration comprising:
   a semiconductor substrate of a first conductivity type being connected to a first supply potential, having a first region in which switching stages with signal terminals are disposed, and having at least a second region in which at least one connecting line is disposed for connecting said signal terminals of said switching stages;
   a multiplicity of doping zones being disposed in said second region and having a second conductivity type complementary to the first conductivity type, said doping zones being connected to a second supply potential, said doping zones having a total surface area, and at least a portion of said total surface area being located under said at least one connecting line;
   said first and second regions being strip-shaped;
   said first and second regions having long sides bordering one another;
   said second region having a width and each of said doping zones of said second region extending over the width of said second region; and
   said semiconductor substrate having a segment of the first conductivity type being located between each two of said doping zones.

2. The integrated semiconductor configuration according to claim 1, wherein said doping zones are rectangular and have identical dimensions including lengths, and said doping zones are mutually spaced apart by spacings being equal to the lengths of said doping zones.

3. The integrated semiconductor configuration according to claim 2, wherein said first region has a doping zone of the second conductivity type on the long side thereof extending over the length of the long side, and said doping zones of said first and second regions are connected.

* * * * *